US005250869A

United States Patent [19]

Ishikawa et al.

[11] Patent Number: 5,250,869

[45] Date of Patent: Oct. 5, 1993

[54] ULTRASONIC TRANSDUCER

[75] Inventors: Hiroshi Ishikawa, Kawasaki; Kazuhiro Watanabe, Tokyo; Kiyoto Matsui; Yasushi Hara, both of Kawasaki; Kenji Kawabe, Yokohama; Takaki Shimura, Tokyo, all of Japan

[73] Assignee: Fujitsu Limited, Kanagawa, Japan

[21] Appl. No.: 768,445

[22] PCT Filed: Oct. 25, 1990

[86] PCT No.: PCT/JP90/01374

§ 371 Date: Sep. 26, 1991

§ 102(e) Date: Sep. 26, 1991

[87] PCT Pub. No.: WO91/13588

PCT Pub. Date: Sep. 19, 1991

[30] Foreign Application Priority Data

Mar. 14, 1990 [JP] Japan .................................. 2-63901

[51] Int. Cl.[5] ...................... H01L 41/04; H04R 17/00

[52] U.S. Cl. .................................... 310/334; 310/335

[58] Field of Search ............... 310/334, 335, 336, 326, 310/327, 345

[56] References Cited

U.S. PATENT DOCUMENTS

| | | | |
|---|---|---|---|
| 3,924,259 | 12/1975 | Butler et al. | 390/5 R |
| 4,242,912 | 1/1981 | Burckhardt et al. | 73/626 |
| 4,425,525 | 1/1984 | Smith et al. | 310/336 |
| 4,460,841 | 7/1984 | Smith et al. | 310/334 |
| 4,518,889 | 5/1985 | 'T Hoen | 310/357 |
| 4,530,363 | 7/1985 | Brisken | 128/661.09 |
| 4,550,606 | 11/1985 | Drost | 73/626 |
| 4,672,592 | 6/1987 | Skinner | 367/159 |
| 5,054,323 | 10/1991 | Hubbard, Jr. et al. | 73/754 |
| 5,115,810 | 5/1992 | Watanabe et al. | 128/662.03 |

FOREIGN PATENT DOCUMENTS

| | | |
|---|---|---|
| 59-118972 | 7/1983 | Japan . |
| 59-20157 | 2/1984 | Japan . |
| 61-76949 | 4/1986 | Japan . |
| 61-209642 | 9/1986 | Japan . |

*Primary Examiner*—Steven L. Stephan
*Assistant Examiner*—D. R. Haszko
*Attorney, Agent, or Firm*—Nikaido, Marmelstein, Murray & Oram

[57] ABSTRACT

The present invention relates to an ultrasonic transducer for controlling an ultrasonic beam with the vibrators arranged and particularly to an ultrasonic transducer having improved the ultrasonic beam characteristic in the short axis direction in order to realize a high image quality ultrasonic diagnostic apparatus. The present invention is aimed at improving the ultrasonic beam characteristic and therefore the present invention discloses an ultrasonic transducer for controlling ultrasonic beam using many vibrators arranged in the form of an array in which a composite piezoelectric element (1) is used as an electric-acoustic conversion element of the vibrator and the electrode (2) divided in the short axis direction orthogonally crossing the arrangement direction of many vibrators is also provided on the composite piezoelectric vibrator (1).

14 Claims, 21 Drawing Sheets

ULTRASONIC TRANSDUCER

DESCRIPTION

1. Field of the Invention

The present invention relates to an ultrasonic transducer for controlling an ultrasonic beam with arranged vibrators and particularly to an ultrasonic transducer which has an improved ultrasonic beam characteristic in the short axis direction in order to realize a high image quality ultrasonic diagnostic apparatus.

2. Background of the Invention

An array type ultrasonic transducer arranging many vibrators of the present invention is shown in FIG. 1.

In FIG. 1, the reference numeral 71 denotes many piezoelectric vibrators consisting of piezoelectric elements; 72, backing; 73, acoustic lens; 74, FPC (Flexible Printed Circuit Board); 75, electrode lead wire. At both front and rear surfaces of the piezoelectric vibrator 71, the electrode surfaces are formed and the electrode lead wire 75 is electrically connected to such electrode surfaces. In general, one piezoelectric vibrator 1 has the sizes of 15 to 20 mm in the short axis direction and about 0.6 mm in the arrangement direction. These numerical values are applied to an ultrasonic transducer with the center frequency of 3.5 MHz (hereinafter, the ultrasonic transducer explained in this specification is formed as laminated layers).

The ultrasonic beam irradiation characteristic of this ultrasonic transducer is shown in FIG. 2. In this figure, the vertical axis indicates beam width and the zero position at the center corresponds to the center area of the vibrator 71 in the short axis direction. The horizontal axis indicates the scanning distance from the vibrator 71 (namely, separated distance). The characteristic (i) in this figure shows the −10 dB beam width, while (ii) the −20 dB beam width. Here, aperture of the ultrasonic transducer is 20 mm in size and the focal length of lens is 140 mm.

As the characteristic of the ultrasonic beam, uniform and narrow beam width for the region covering the short distance to long distance from the ultrasonic transducer is desirable in order to obtain a high quality image, but as can be understood from FIG. 2, the ultrasonic transducer explained above provides a narrow beam width in the vicinity separated by 140 mm from the focal point of lens but provides a wide beam width in the short and long distance areas other than in such a vicinity of the focal point.

Therefore, as a method of the prior art for improving the ultrasonic beam characterisic of such a vibrator in the short axis direction, it has been proposed to adequately change the size of the aperture depending on the scanning distance by increasing or decreasing the size of the aperture through division of the piezoelectric vibrator into a plurality of sections in the short axis direction.

An ultrasonic transducer of the prior art which can vary the size of the aperture is shown in FIG. 3. In this ultrasonic transducer, the piezoelectric vibrator 71 is divided in the short axis direction orthogonally crossing the arrangement direction of many piezoelectric vibrators 71 arranged like an array and the cutting grooves 76 are applied to the piezoelectric vibrator 71 as shown in the figure to divide the vibrator into three sections forming a center vibrator 71 (1) and other vibrators 71 (2) in both sides thereof.

In general, when an aperture of the piezoelectric vibrator is small in size, the narrow beam width can be attained for the entire distance of scanning as shown in (i) of FIG. 5. Meanwhile, when an aperture is large in size, the beam width may be set narrow particularly in a certain constant scanning distance (focal point of lens) but it is widened in comparison with that when the beam width and aperture become small in size at the other short and long distances from the focal point.

Therefore the ultrasonic transducer indicated in FIG. 3 changes the size of the aperture depending on the scanning distance by utilizing the beam characteristic which changes depending on size of aperture explained above. Namely, for the short and far distance, the size of aperture is substantially reduced by driving only the piezoelectric vibrator 71 (1) and thereby the irradiated ultrasonic beam width is narrowed. Moreover, at the particular focal point between the short and far distance areas, the size of aperture is substantially increased by driving the piezoelectric vibrators 71 (2) in addition to the piezoelectric vibrator 71 (1) and thereby the beam width at this position is further narrowed.

The ultrasonic beam characteristic of the ultrasonic transducer shown in FIG. 3 is indicated in FIG. 4. In this figure, the vertical axis indicates beam width, while the horizontal axis the scanning distance. (i) is the −10 dB beam width characteristic and (ii) the −20 dB beam width characteristic. Here, only the piezoelectric vibrator 71 (1) is driven for the scanning distance from 0 to 90 mm and the size of aperture is set to 8 mm. On the other hand, both piezoelectric vibrators 71 (1) and 71 (2) are driven for the scanning distance of 90 mm or longer and the size of aperture is set to 20 mm.

As is apparent from comparison of FIG. 4 with FIG. 2, the ultrasonic transducer of FIG. 3 is more improved in the ultrasonic beam characteristic than that of FIG. 1.

In the case of dividing the piezoelectric vibrator of the ultrasonic transducer, the dividing must be done perfectly so that the divided piezoelectric vibrators are independent of each other. Otherwise, the divided piezoelectric vibrators are mechanically coupled in the lateral direction and a sidelobe may be generated. Thereby, the desired beam pattern cannot be obtained.

For realizing perfect division of the vibrator, a deep cutting groove is formed on the piezoelectric vibrator to perfectly separate not only the electrode surface but also the piezoelectric material. However, when the vibrator is cut into many sections, the cutting process is very complicated. Thereby, it becomes very difficult to form such an ultrasonic transducer.

SUMMARY OF THE INVENTION

An ultrasonic transducer of the present invention controls, as the one profile, the ultrasonic beam using many vibrators arranged in the form of array with the structure that a composite piezoelectric vibrator is used as an electic-acoustic conversion element of the vibrator and the size of aperture in the short axis direction can be increased or decreased by dividing the electrode surface of vibrator for the short axis direction orthogonally crossing the arrangement direction.

Moreover, an ultrasonic transducer of the present invention is structured, as the other profile, so that a single sheet of composite piezoelectric vibrator is used in above profile and division of the vibrator in the arrangement direction is carried out through division of the electrode surface of the composite piezoelectric vibrator.

An ultrasonic transducer of the present invention is also structured, as the other profile, so that amplitude intensity is distributed in such a manner that amplitude intensity of each vibrator is large at the center in the short axis direction and the amplitude intensity is reduced gradually as it goes to the end portions.

A means for giving distribution of amplitude intensity in the short axis direction may be realized by forming a composite piezoelectric vibrator so that the electrical-mechanical coupling coefficient thereof becomes large at the center in the short axis direction and the coefficient becomes smaller gradually as it goes to the end portions.

In addition, a means for distributing the amplitude intensity in the short axis direction may be realized by forming the electrode surface of each vibrator so that the area thereof becomes wide at the center in the short axis direction and becomes narrow as it goes to the end portions.

Moreover, the ultrasonic beam can further be improved by setting the width in the arrangement direction of the electrode surface to 0.4 or less at the end portion when that of the electrode surface is set to 1 at the center for each aperture.

BRIEF DESCRIPTION OF THE DRAWINGS

The accompanying drawings of this specification will be briefly explained hereunder.

PREFERRED EMBODIMENT OF THE PRESENT INVENTION

Figure 1:
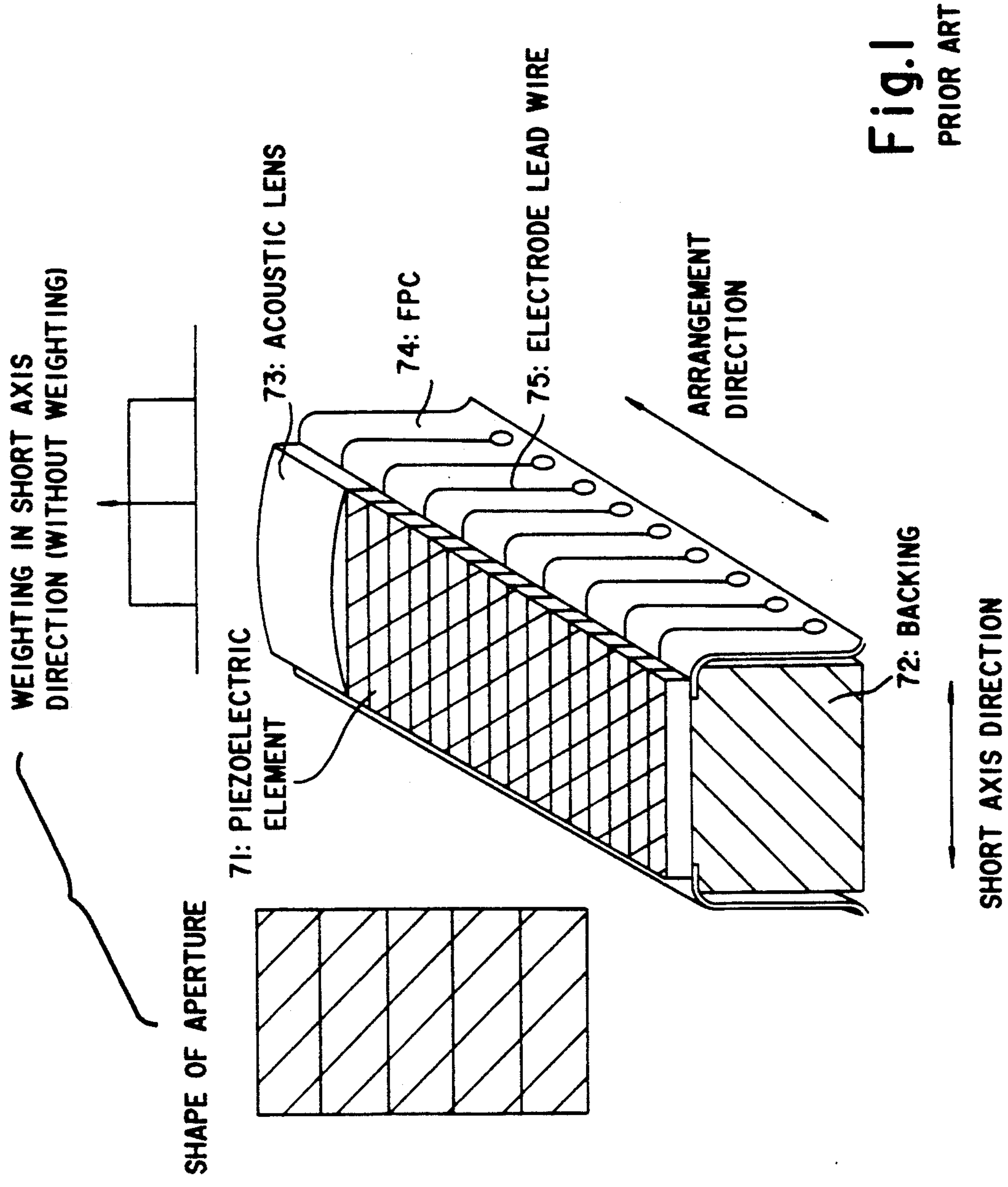
Fig.1 PRIOR ART
FIG. 1 is a diagram for explaining an ultrasonic transducer of the prior art.
Figure 2:
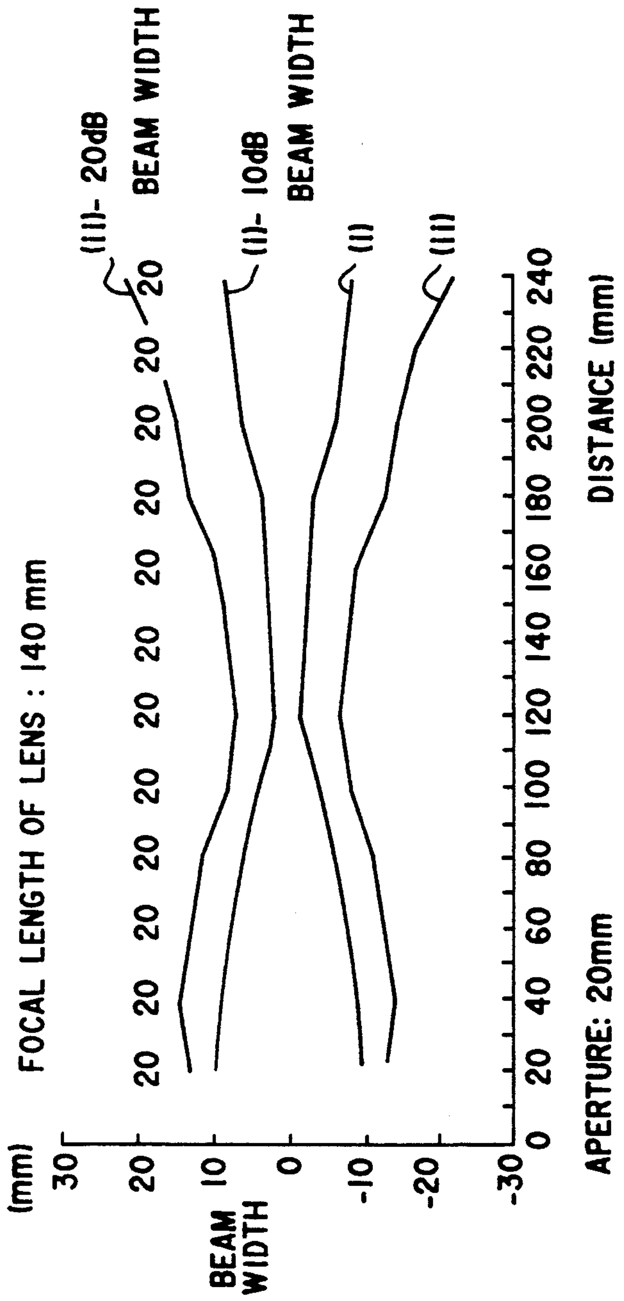
Fig.2 PRIOR ART
FIG. 2 is a diagram for explaining the ultrasonic beam characteristic of an ultrasonic transducer of FIG. 1.
Figure 3:
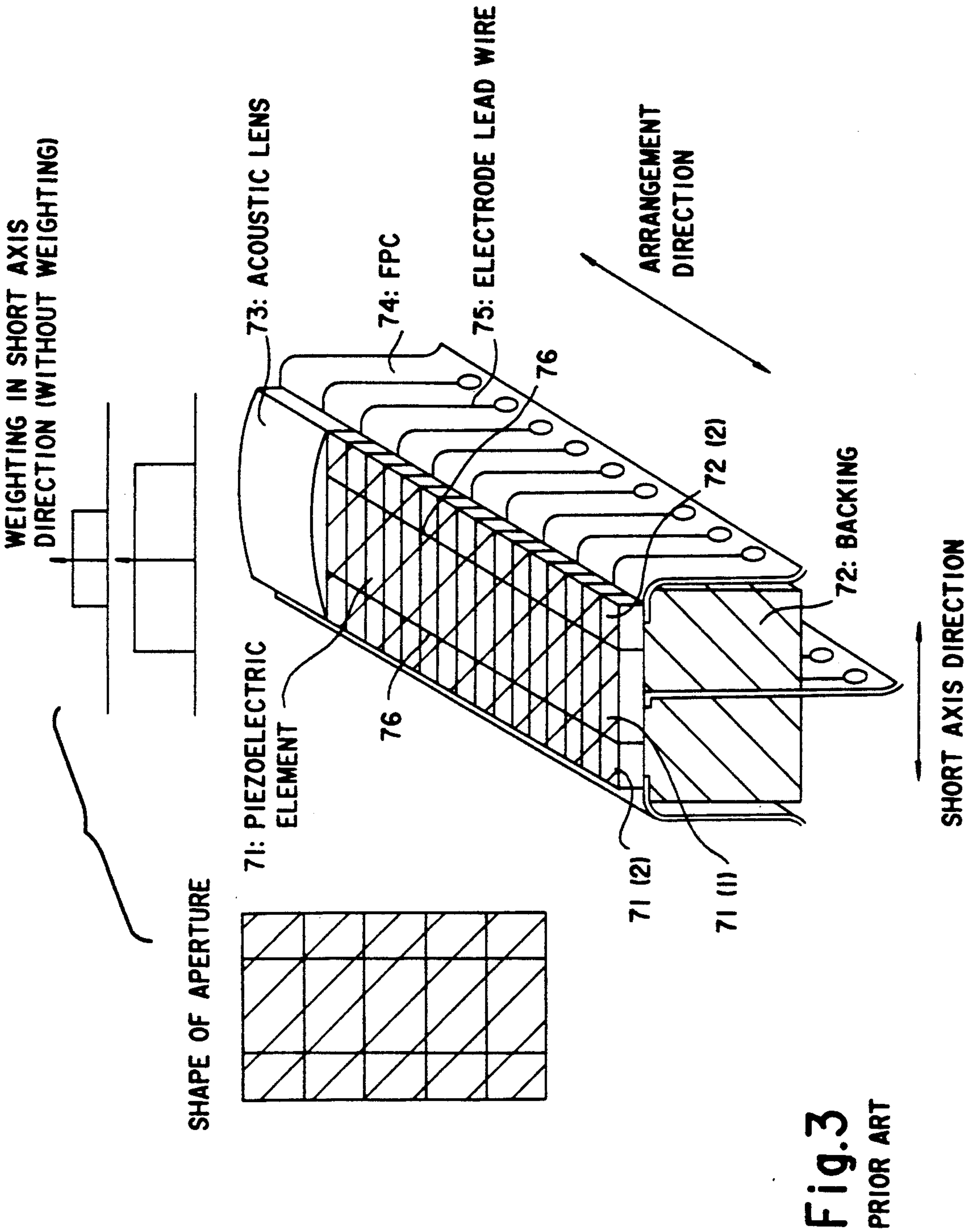
Fig.3 PRIOR ART
FIG. 3 is a diagram for explaining an ultrasonic transducer of the prior art having an improved ultrasonic transducer of FIG. 1.

In case a composite piezoelectric vibrator is used as an electric-acoustic conversion element for an amplitude signal through employment of the present invention, mechanical coupling in the lateral direction of the composite piezoelectric vibrator is very small. Therefore, it is possible, on the occasion of dividing the vibrator in the short axis direction, to divide the vibrator only by dividing the electrode plane without forming deep cutting grooves to the piezoelectric material portion.

The machining for dividing only the electrode surface may be realized very easily and thereby the ultrasonic transducer may also be manufactured easily.

Moreover, such division is not limited to the division of the vibrator in the short axis direction and division in the arrangement direction can also be realized by division of the electrode plane.

The ultrasonic transducer of the present invention is also capable of improving the ultrasonic beam characteristic by simultaneously employing the means having an amplitude intensity distribution, in the short axis direction, which becomes large at the center and becomes small in both side portions.

Various means may be employed for having an amplitude intensity distribution. For instance, it is possible to form a composite piezoelectric vibrator itself in which the electric - mechanical coupling coefficient of the composite piezoelectric vibrator becomes large at the center but becomes small at both end portions.

Moreover, it is also allowed that the electrode surface of vibrator becomes large and becomes small in both end portions. In this case, since the area of the composite piezoelectric vibrator to which the signal is applied becomes smaller as it goes to the end portion thereof, the amplitide intensity distribution may be set smaller as it goes to the end portion.

Or, when a resistance layer, which becomes thicker as it goes to the end portion, is provided between the composite piezoelectric vibrator and electrode plane, the amplitude of the voltage of the signal to be applied becomes smaller as it goes to the end portion due to the voltage drop in the thickness direction of this resistance layer and thereby the amplitude intensity distribution may become smaller as it goes to the end portion.

In addition, when the electrode plane is formed with a resistance material, the signal voltage applied at the center of electrode may become smaller as it goes to the end portion due to the voltage drop of resistance material in the short axis direction and thereby the amplitude intensity distribution may become smaller as it goes to the end portion.

Furthermore, when the electrode plane is formed by a resistance material and a switch for grounding the position is provided in the intermediate position between the center of electrode plane and the end portion, the electrode area substantially becomes small when the switch is ON and thereby the aperture can be reduced in size. Accordingly, the aperture size of the vibrator may be increased or decreased.

Figure 6:
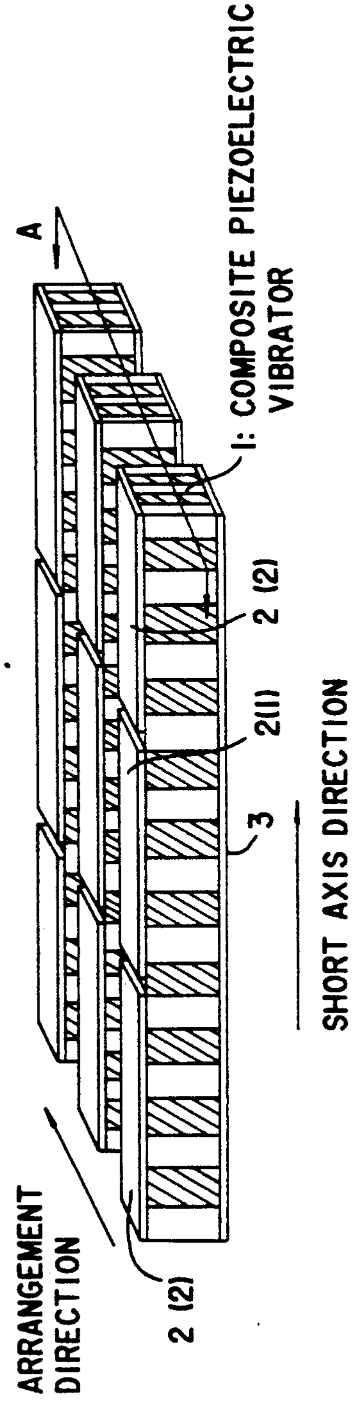
FIG. 6 is a diagram for explaining an ultrasonic transducer as a preferred embodiment of the present invention.

Hereinafter, an embodiment of the present invention may be explained with reference to the drawings. FIG. 6 shows an ultrasonic transducer as an embodiment of the present invention. As shown in this figure, in the ultrasonic transducer which can change the size of the aperture, the electrode planes 2, 3 are formed in both sides of the composite piezoelectric vibrator 1, the one electrode plane 2 is divided into three electrode planes 2 ① and 2 ② in the short axis direction as the electrode plane to which the signal is applied, and the other electrode plane 3 is formed as the electrode plane for grounding.

Here, the composite piezoelectric vibrator 1 is very small mechanical coupling in the lateral direction and is formed by many piezoelectric elements and an insulator (for example, epoxy resin) surrounding such a piezoelectric element. They are distributed uniformly.

Figure 7:
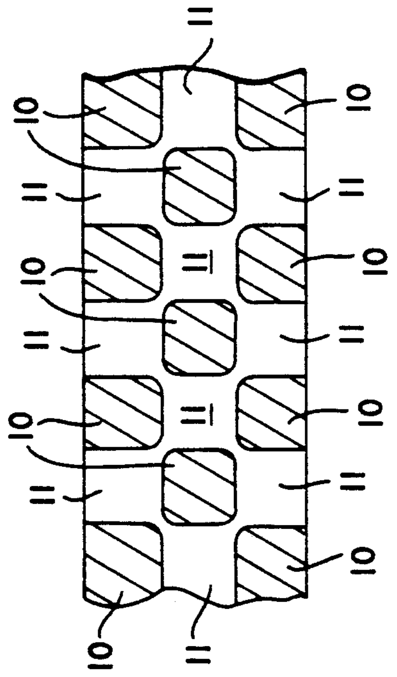
FIG. 7 is a diagram for explaining a structure of a composite piezoelectric vibrator in the preferred embodiment.

FIG. 7 shows a sectional view in the direction of arrow mark A of FIG. 6. As will be understood from this figure, the piezoelectric elements 10 consisting of piezoelectric material and insulators 11 are arranged in the form of matrix and each piezoelectric elements 10 are mutually separated by the insulators 11. Each piezoelectric element is in size of about 0.1 mm square.

As explained above, when a composite piezoelectric vibrator is used as an electric - acoustic conversion element of the ultrasonic transducer, the lateral mechanical coupling may be eliminated, on the occasion of dividing each piezoelectric vibrator in the short axis direction, only by dividing only the electrode plane, for example, into the electrode planes 2 ① and 2 ②. Such a division of the electrode plane may be done easily even when the number of divisions increases and thereby such an ultrasonic transducer may be manufactured easily.

Various changes or modifications are possible for the embodiment of the present invention. For instance, not only the division in the short axis direction but also the division in the arrangement direction of each vibrator may be realized only with the division of the pattern at the electrode plane. Namely, an electric - acoustic conversion element, which is common to all vibrators is formed by a single sheet of composite piezoelectric vibrator and the electrode plane at the surface is divided in the form of an array in the arrangement direction. Moreover, the electrode plane is also divided in the short axis direction to increase or decrease the apertures. Namely, the cutting groove is no longer necessary unlike the prior art.

Moreover, as a method of further improving ultrasonic beam characteristic in the short axis directon, the weighting is conducted so that the amplitude intensity of ultrasonic transducer becomes large at the center in the short axis direction and becomes smaller as it goes to the end portion. With employment of this method together, the beam characteristic realized has a further reduced sidelobe.

Hereinafter, various embodiments for changing such an amplitude intensity distribution will be explained.

Figure 8A:
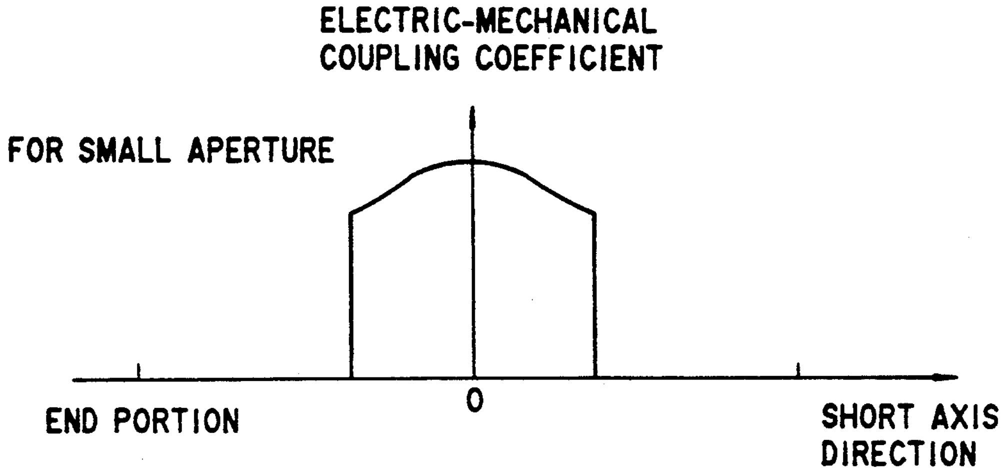
FIGS. 8(A)-8(B) are diagrams for explaining an embodiment having an amplitude intensity distribution in the short axis direction.
Figure 8B:
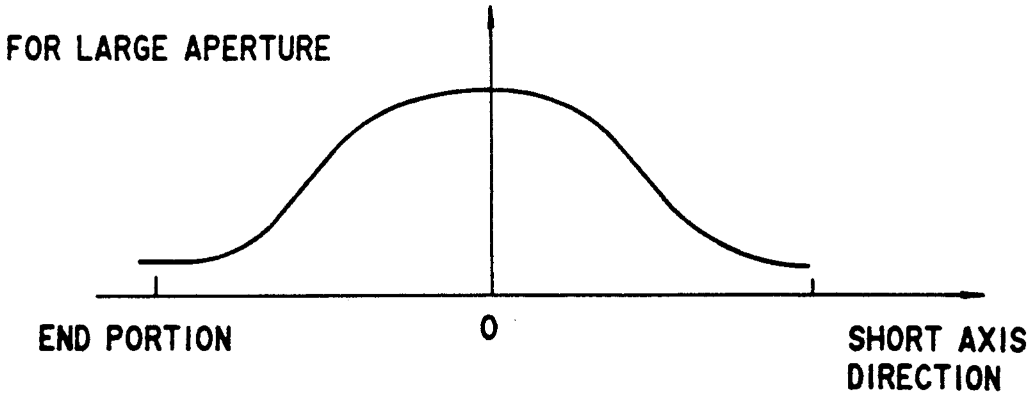

First, as a first embodiment, an ultrasonic transducer shown in FIG. 6 is manufactured so that a composite piezoelectric vibrator 1 itself has different electric-mechanical coupling coefficients at the center and the end portions in the short axis direction. For instance, as shown in FIGS. 8(A)–8(B), a composite piezoelectric vibrator 1 is manufactured in such a manner that the electric-mechanical coefficient is large at the center and becomes smaller as it goes to the end portion in the short axis direction. Thereby, each vibrator has an electric-mechanical coupling characteristic as shown in FIG. 8[A] when the aperture is small (when only the center electrode 2 ① is driven), meanwhile, it has a coupling coefficient as shown in FIG. 8[B] when the aperture is large (when all electrodes 2 ① and 2 ② are driven). Thereby, amplitude intensity is gradually reduced from the center to the end portion.

Figure 9:
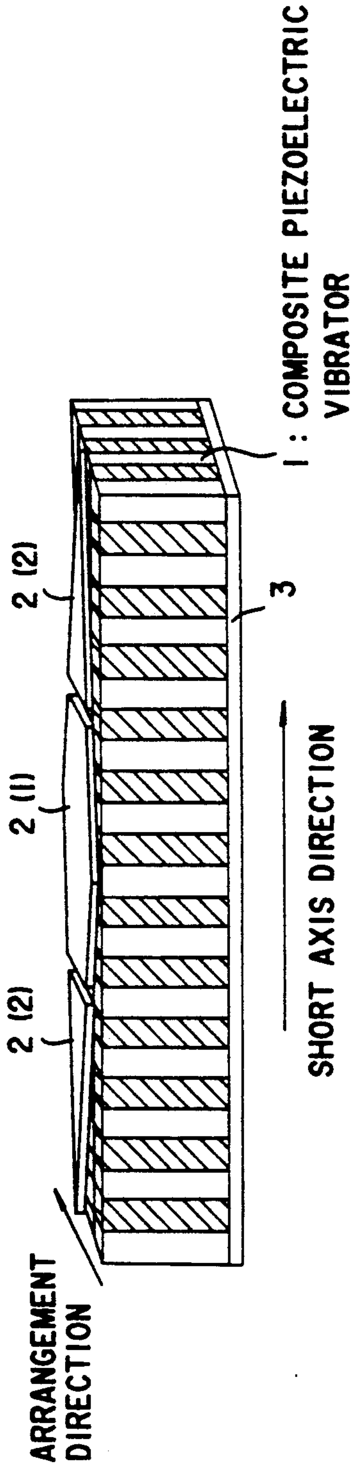
FIG. 9 is a diagram for explaining another embodiment having an amplitude intensity distribution in the short axis direction.
Figure 12A:
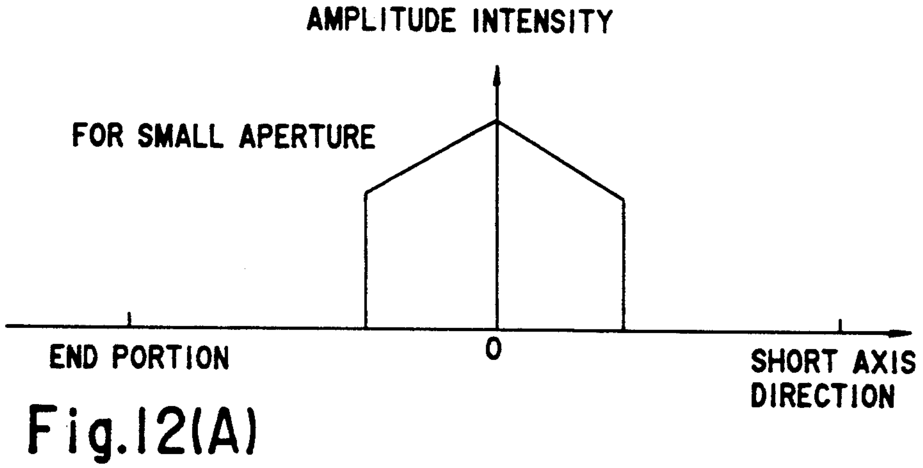
FIGS. 12(A)-12(B) are diagrams for explaining the amplitude intensity distribution in the embodiment of FIG. 9.
Figure 12B:
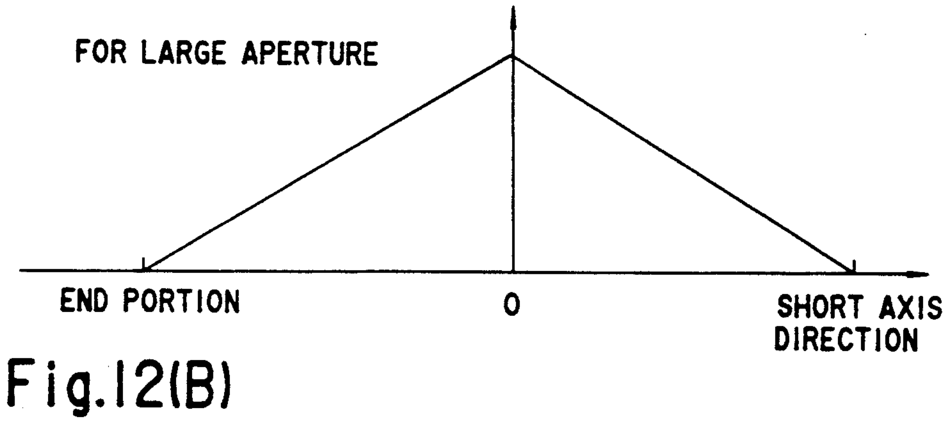

FIG. 9 shows an embodiment which gives amplitude intensity distribution in the short axis direction. This embodiment changes the area of the electrode plane at the center and end portions. Namely, the center area of electrode plane is wide and it becomes narrow as it goes to the end portion. The amplitude intensity distribution when the electrode plane area changes as explained above is shown in FIGS 12(A)–12(B). When the aperture is small, the characteristic shown in FIG. 12[A] is obtained and when the aperture is large, the characteristic shown in FIG. 12[B] is obtained. In this case, the amplitude intensity is gradually reduced as it goes to the end portion from the center.

Figure 10A:
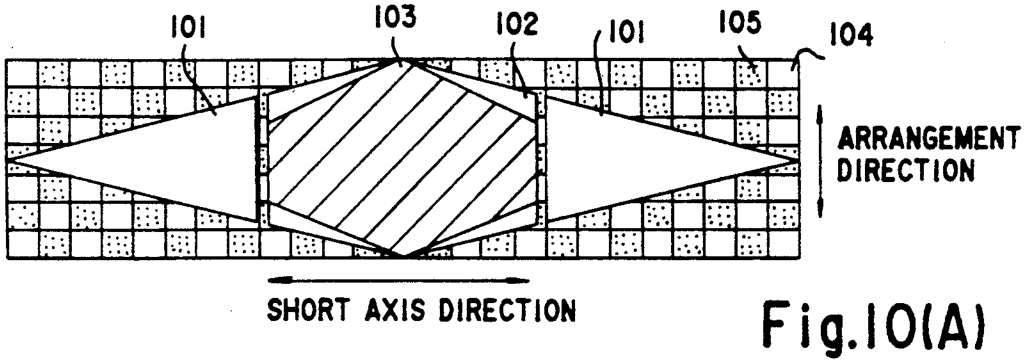
FIGS. 10(A)-10(D) are diagrams for explaining an embodiment where the outline of the small aperture in the short axis direction is not common to the outline of the large aperture.
Figure 10B:
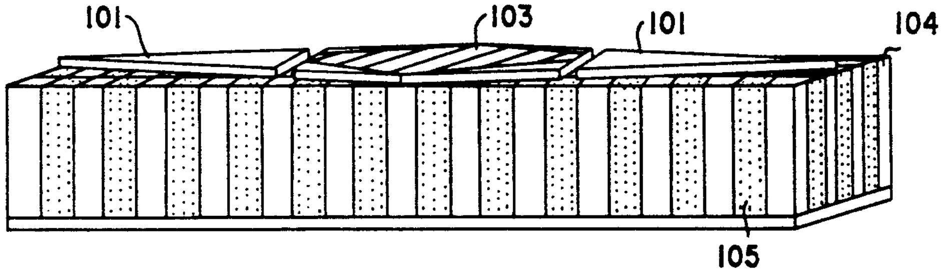
Figure 10C:
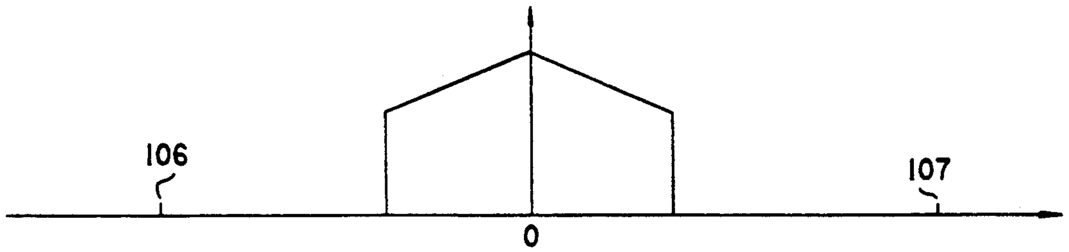
Figure 10D:
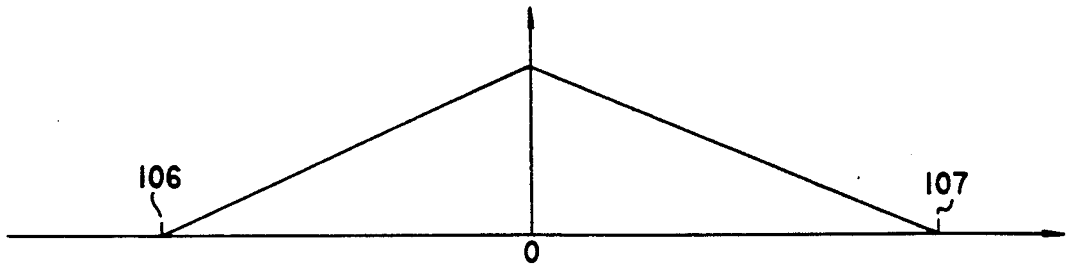

In addition, another embodiment is shown in FIGS. 10(A)–10(B). This embodiment corresponds to the case where the aperture is small and the outline in the short axis direction is not common to the outline of the large aperture. FIG. 10[A] is a plan view of the electrode side wherein the electrode is provided to the vibrator. FIG. 10[B] is a perspective view of a vibrator of FIG. 10[A]. The arrow marks for explanation of FIG. 10[A] indicate the short axis and arrangement directions. A vibrator is a composite piezoelectric vibrator. The reference numeral 105 denotes an insulator; 104, piezoelectric vibrator; 101, 102, 103, electrode. A large size aperture beam may be realized with the electrodes 101, 102, 103 and a small size aperture beam only with the electrode 103.

FIG. 10[C] shows weighting of amplitude intensity distribution when the aperture is small, while FIG. 10[D] shows weighting of the amplitude intensisty distribution when the aperture is large. Respective graphs indicate the short axis direction of the ultrasonic transducer in the horizontal direction and numerals 106 and 107 indicate the left and right end portions toward the drawing of the vibrator of FIGS. 10[A], 10[B]. The vertical axis of FIG. 10[C], 10[D] indicates intensity of amplitude.

Figure 4:
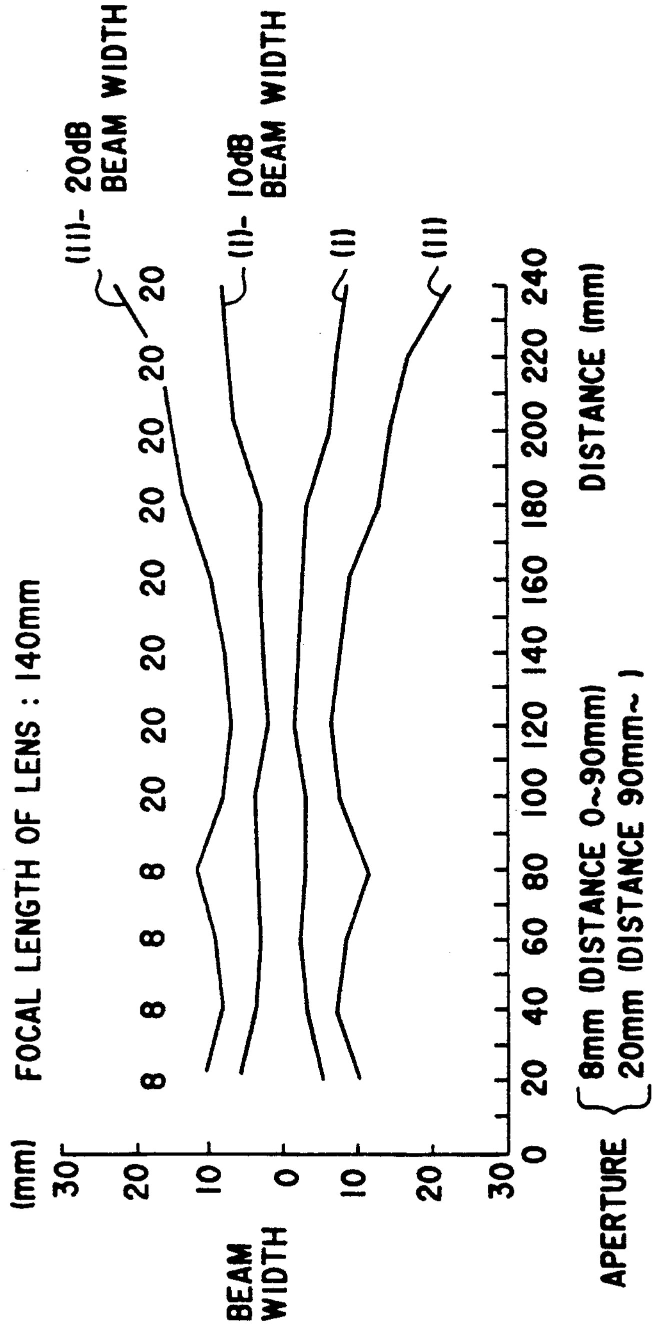
Fig.4 PRIOR ART
FIG. 4 is a diagram for explaining the ultrasonic beam characteristic of an ultrasonic transducer of FIG. 3.
Figure 5:
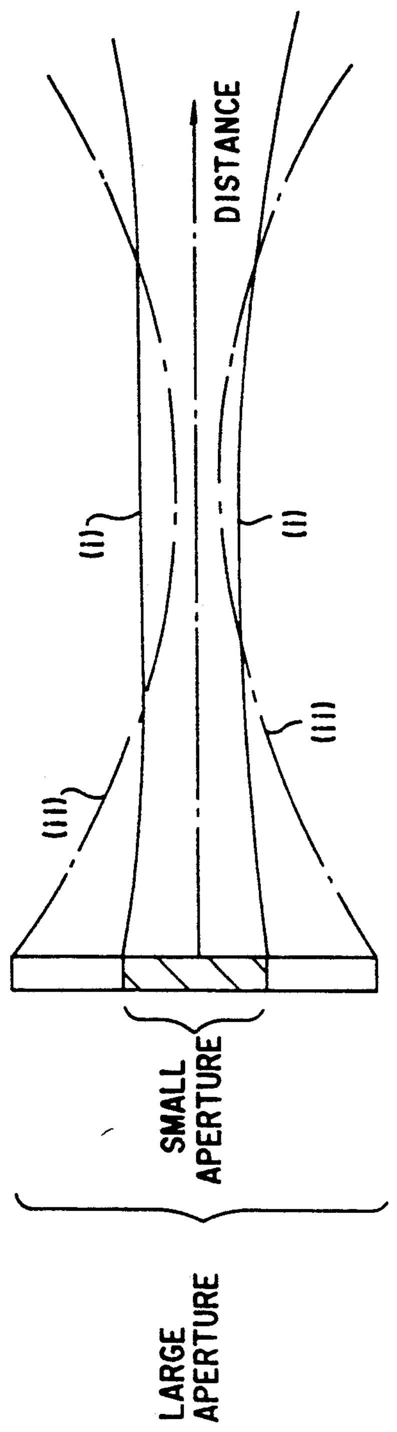
Fig.5 PRIOR ART
FIG. 5 is a diagram for explaining the ultrasonic beam characteristics of piezoelectric elements having a small size aperture and a large size aperture.
Figure 11:
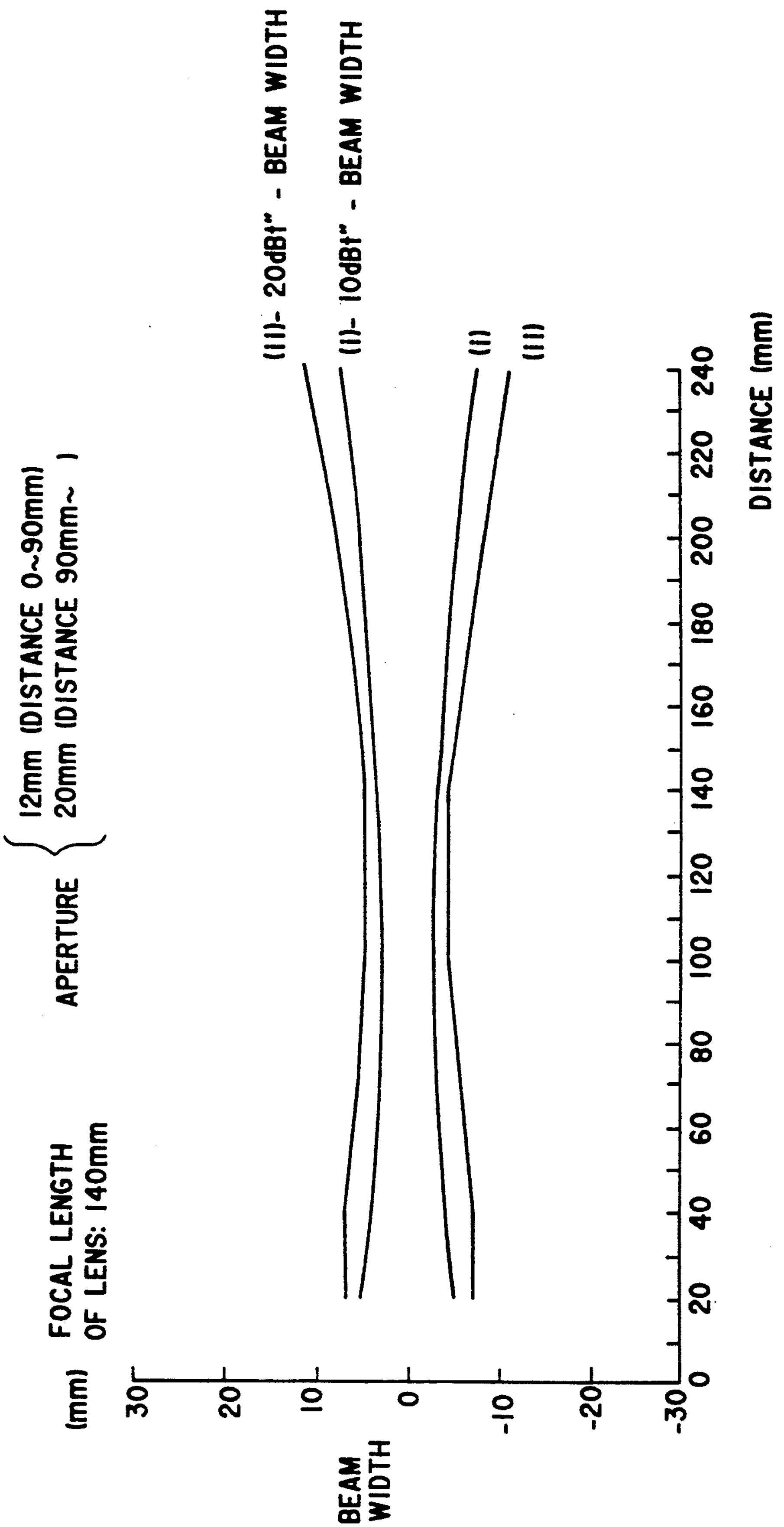
FIG. 11 is a diagram indicating an ultrasonic beam characteristic of the embodiment of FIG. 9.

Next, the ultrasonic beam characteristic of the embodiment of FIG. 9 is shown in FIG. 11. Here, comparison with FIG. 4 indicating the characteristic of the prior art, it can be understood that the ultrasonic beam characteristic is well improved for short distance and long distance areas.

Figure 13:
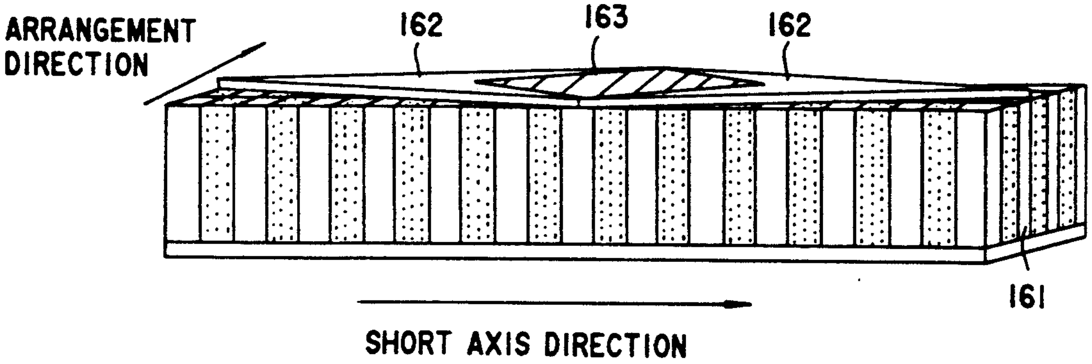
FIG. 13 is a diagram for explaining an embodiment where the electrode area is changed.
Figure 14A:
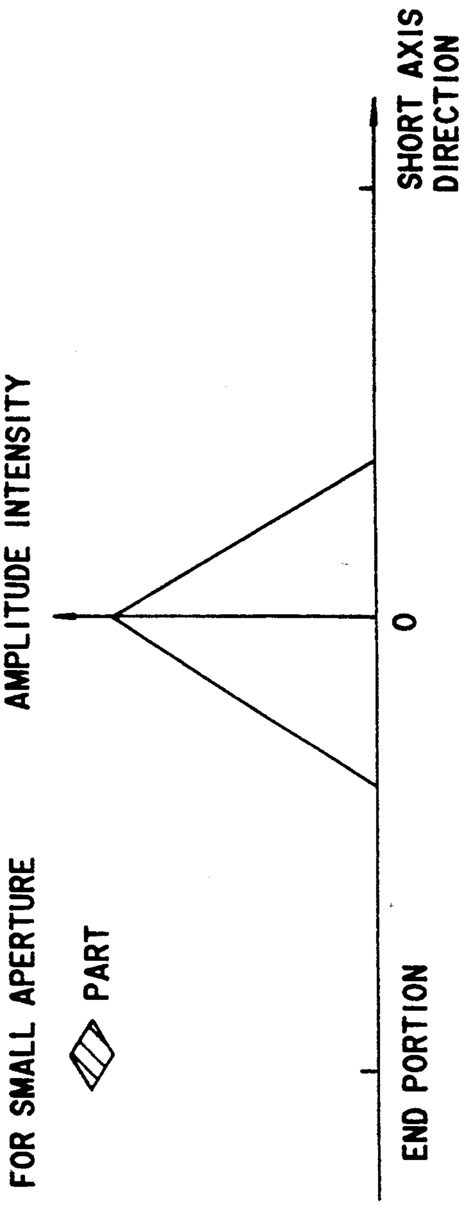
FIGS. 14(A)-14(B) are diagrams for explaining amplitude intensity distribution of the embodiment of FIG. 13.
Figure 14B:
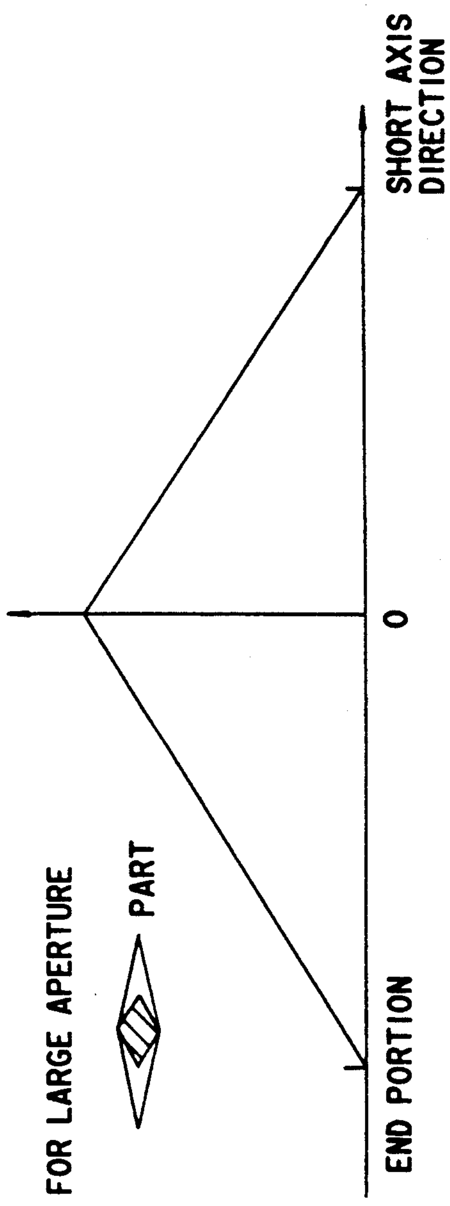

Moreover, the amplitude intensity distribution when the electrode area is changed like FIG. 13 is indicated in FIGS. 14(A)–14(B). Here, the characteristic when the aperture is small is shown in FIG. 14[A], and that when the aperture is large is shown in FIG. 14[B].

Figure 15:
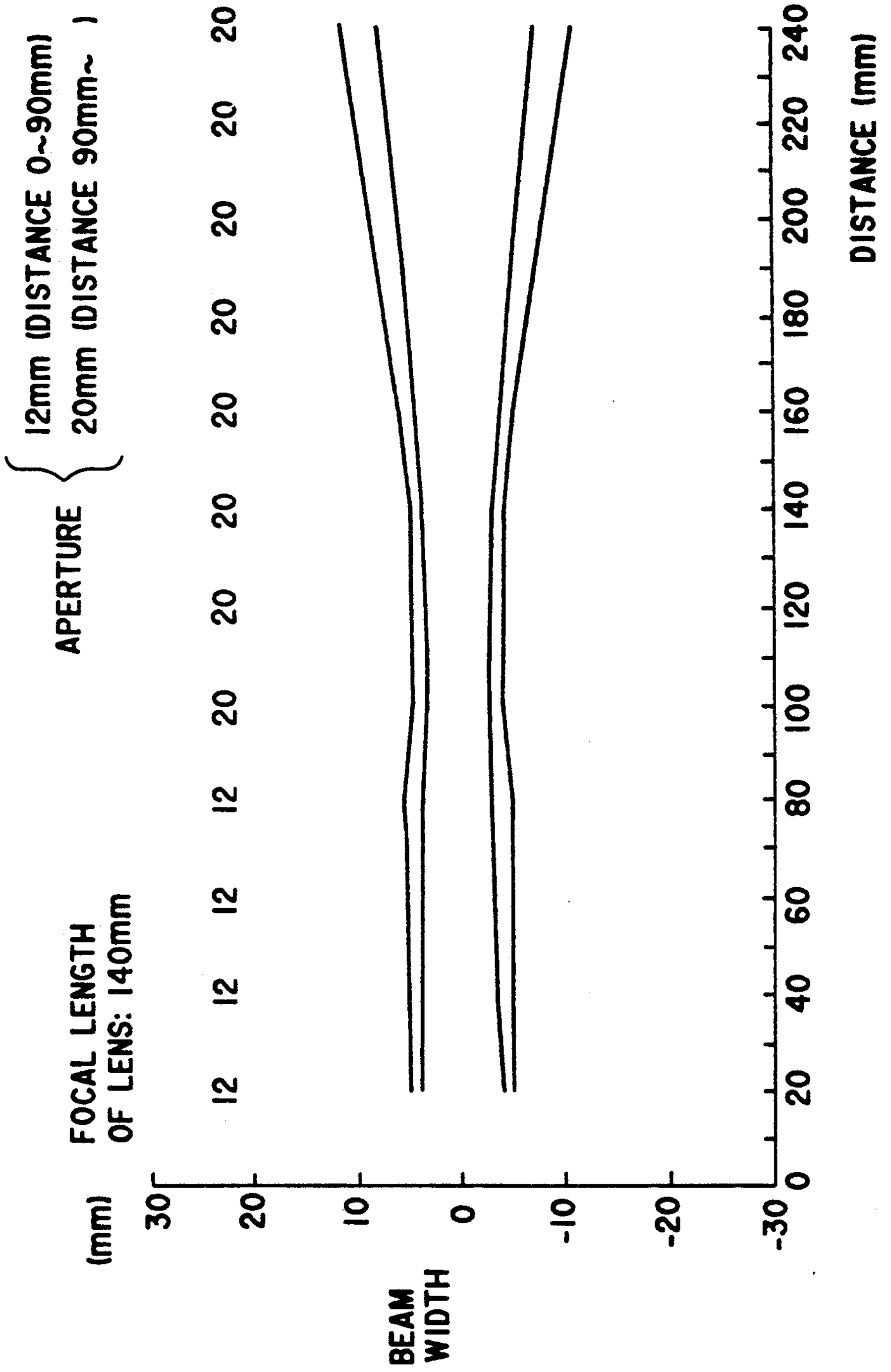
FIG. 15 is a diagram for explaining the ultrasonic beam characteristic of the embodiment of FIG. 13.

The ultrasonic beam characteristic of the embodiment of FIG. 13 is shown in FIG. 15. Here, in comparison with FIG. 11, the ultrasonic beam characteristic is improved in the short distance area.

FIG. 13 shows the electrodes formed for each large and small apertures so that the width of electrode plane in the arrangement direction is set to 1 at the center and to 0 at the end portion in the short axis direction. However, a good beam can actually be obtained even when the width is not 0 at the end portion. Namely, a good beam can be obtained under the condition that the ratio of the electrode width at the center and that at the end portion is 1:0.4 or less.

FIG. 16[A] shows an ultrasonic field in the long distance of 220 mm when the electric-mechanical coupling coefficient at the center of the piezoelectric element is set to 1 and that of end portion is set to 0.3. In FIG. 16[B], such an electric-mechanical coupling coefficient at the end portion is set to 0.4. When the electric mechanical coupling coefficient at the end portion is set to 0.4 like FIG. 16[A], the sidelobe reaches the −20 dB line and the beam width is remarkably deteriorated.

On the other hand, when the coupling coefficient at the end portion is set to 0.3 like FIG. 16[B], the sidelobe does not reach the −20 dB line and the beam is not deteriorated. This can also be said for the coupling coefficient at the end portion of 0.2 and 0.1.

As explained above, the reference line is set to −20 dB because of the following reason. As is well known in the actual ultrasonic diagnosis, the internal image of a blood vessel is missed at the −20 dB beam width on the occasion of observing the tubular vessel like a blood vessel. Therefore, in the embodiment of FIGS. 10(A-)–10(B), the effect may be more improved by setting the amplitude intensity at the end portion when the aperture is small to 0.3 or less of the maximum intensity.

Figure 17A:
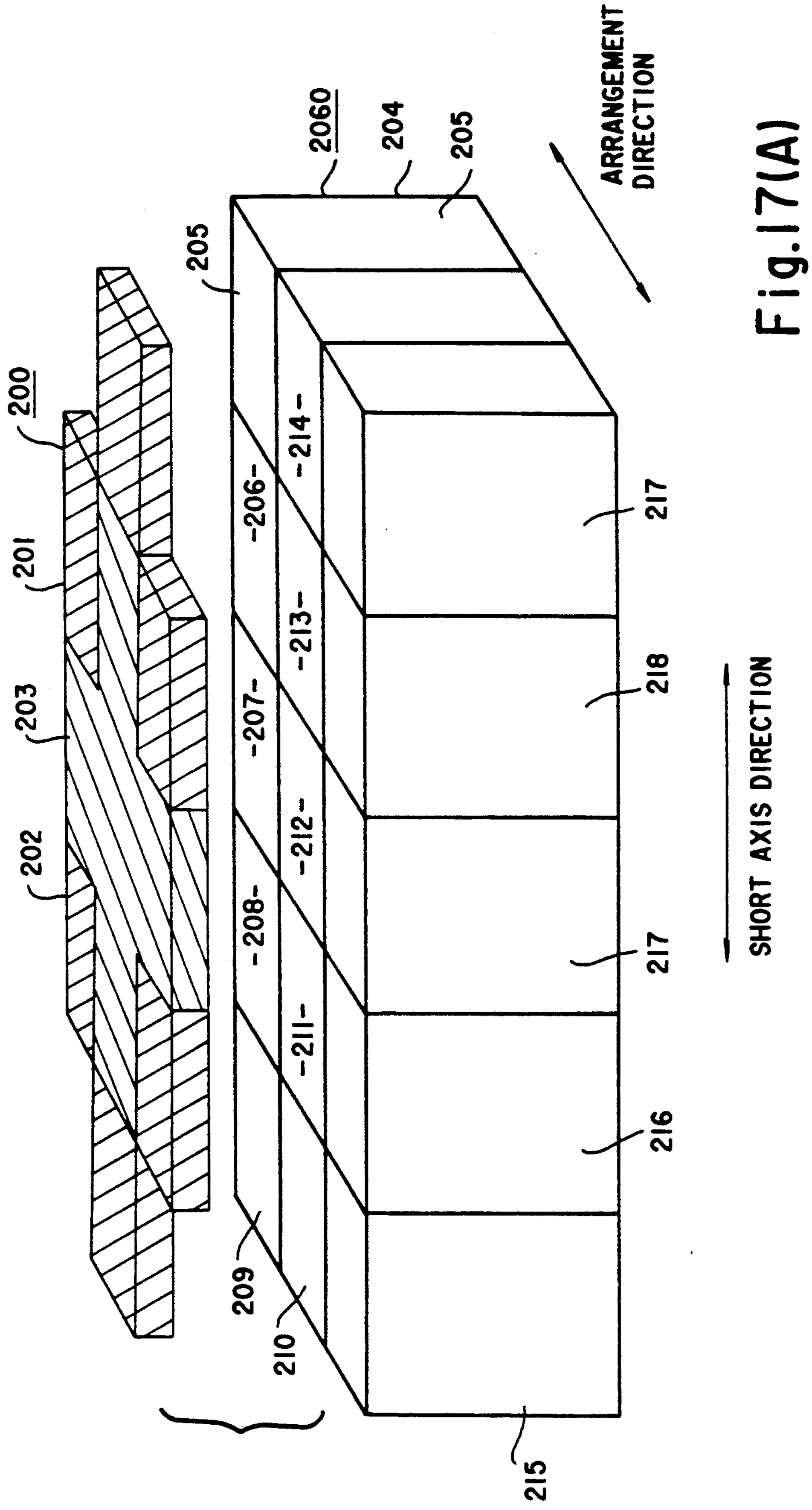
FIGS. 17(A)-17(D) are diagrams for explaining an embodiment where the insulation material of a composite piezoelectric vibrator is arranged with equal intervals in the short axis or arrangement direction.
Figure 17B:
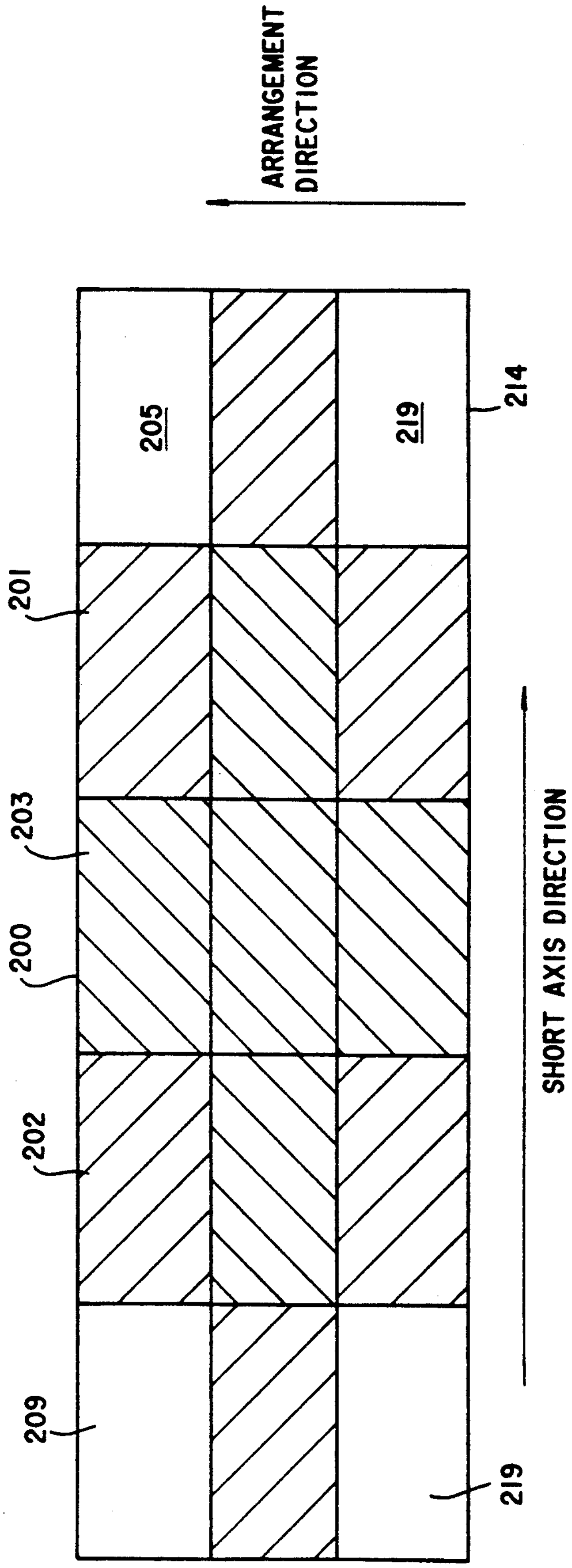
Figure 17C:
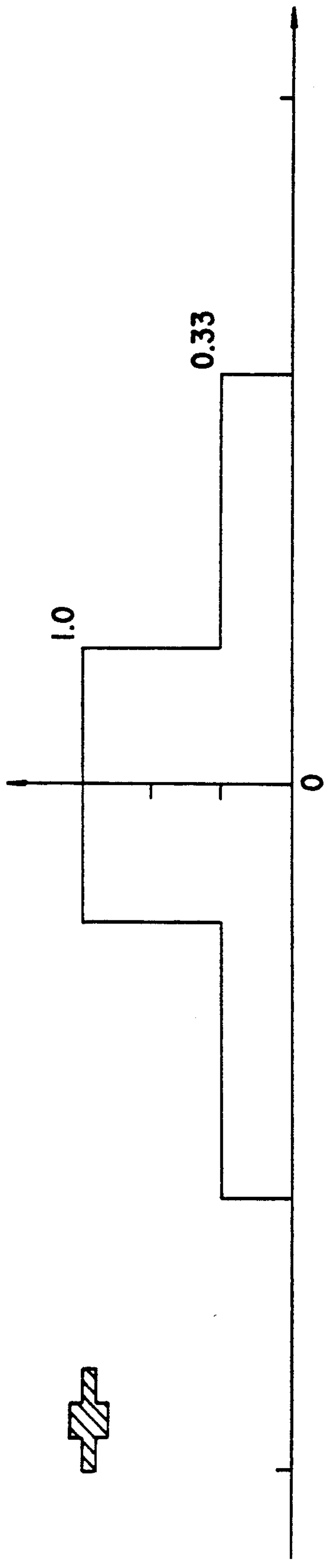
Figure 17D:
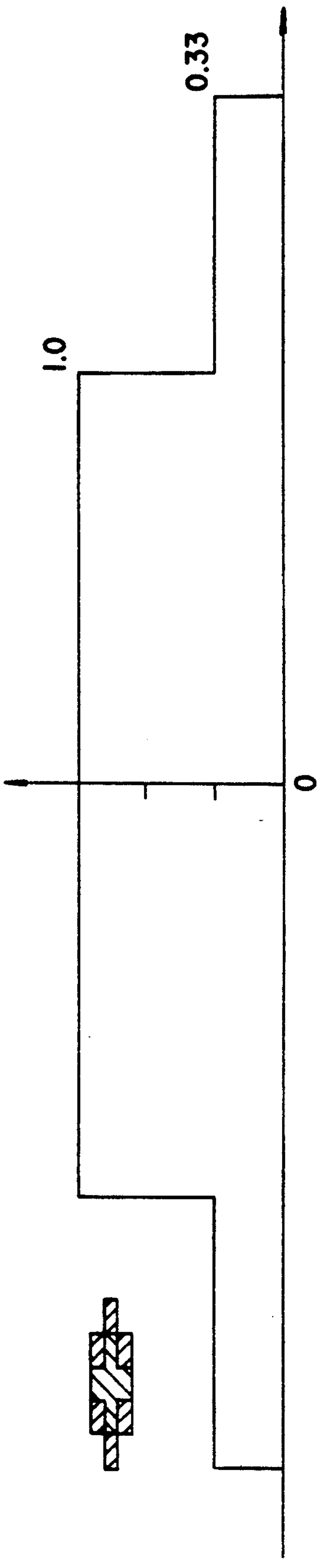

In the embodiment of FIGS. 17(A)–17(B), the insulators of the composite piezoelectric vibrator are provided with equal intervals in the short axis direction or arrangement direction.

In FIG. 17[A], reference numeral 200 denotes electrode. This electrode 200 is formed by three electrodes 201, 202, 203.

The electrode 203 is used when the aperture is small, while the electrodes 201, 202 are used when the aperture is large. When the aperture is small, only the electrode 203 is used and when the aperture is large, three electrodes are used. The reference numeral 2060 denotes a composite piezoelectric vibrator. The arrow marks indicate the short axis direction and arrangement direction, respectively. The reference numeral 204 as a part of 2060 is an insulator and 205, piezoelectric vibrator. In this embodiment, the composite piezoelectric vibrator 2060 for irradiating one ultrasonic beam is formed by a total of 15 piezoelectric vibrators. In case the width in the short axis direction is about 2 cm, the one piezoelectric vibrator has a size of about 400 in the short axis direction. Moreover, the size in the arrangement direction is about 0.1 to 0.2 mm. In the figure, the electrodes 202, 203 and 201 and piezoelectric vibrator 2060 are separated for the convenience of explanation, the electrodes are actually formed on the vibrators. It will be understood easily for those who are skilled in this art, the shape of electrodes matches the mosaic shape of the composite piezoelectric vibrator 2060 located under the electrode 200. The electrode 203 is fixed on the composite piezoelectric vibrator 2060 covering the piezoelectric vibrators 207, 212, 217, 211 and 213. Moreover, the electrodes 201 and 202 are fixed on the composite piezoelectric vibrator 2060 respectively. The electrode 201 is covering the piezoelectric vibrators 206, 214 and 218 and the electrode 202 is covering the piezoelectric vibrators 208, 210 and 216. Accordingly, when an voltage is applied to the electrode 203, the ultrasonic beam is irradiated from the piezoelectric vibrators 207, 212, 217, 211, 213 and when a voltage is applied to the electrode 201, the beam is irradiated from the piezoelectric vibrators 206, 214, 218 and when a voltage is applied to the electrode 202, the beam is irradiated from the piezoelectric vibrators 208, 210, 216.

FIG. 17[B] is a plan view of FIG. 17[A] observed from the electrode side. In FIG. 17[B], the electrodes are separated for the convenience of explanation but the shape of electrode is the same as that in FIG. 17[A]. As will be apparent from FIG. 17[B], the outline shape of electrodes 201, 202, 203 almost matches the outline of each piezoelectric vibrator.

FIGS. 17[C] and 17[D] show the weighting of the ultrasonic beam of the composite piezoelectric vibrator shown in FIG. 17[A]. This figure shows the characteristic similar to that of FIGS. 12(A)–12(B). The left side of each figure indicates the electrode to which a voltage is applied. FIG. 17[C] indicates amplitude intensity distribution of the ultrasonic beam when the electrode 203 turns ON. FIG. 17[D] indicates amplitude intensity distribution of the ultrasonic beam when the electrodes 201, 202 and 203 turn ON. The numerical data in the graph indicates the amplitude value at each point and a ratio when the maximum value is set to 1. In this embodiment, the weighting is given step by step.

The applicant of the present invention (Fujitsu Limited) has disclosed that when the weighting is given in the step by step to the piezoelectric vibrator, convergence of the ultrasonic beam is approximated to "convergence of ultrasonic beam when the weighting is given to Gaussian distribution of the amplitude intensity of piezoelectric vibrator" by the international application based on the patent cooperation treaty "Ultrasonic Transducer and Method of Manufacturing the Same" (this international patent application is written in Japanese and is filed on Oct. 11, 1990 by the Patent Office in Japan). Based on this patent application, the amplitude intensity of piezoelectric vibrator of this embodiment is distributed in step by step. This embodiment is superior to such an application from the point that the desired step by step distribution may be realized easily by forming the piezoelectric vibrator with the composite piezoelectric vibrator and phase deviation of the ultrasonic beam does not occur. The piezoelectric vibrator is divided like mosaics, and the shape of the electrode is matched with the shape combining one to plural number of piezoelectric vibrators. Thereby, the desired step by step amplitude intensity distribution may be attained and a conventional complicated polarization processing becomes unnecessary.

Figure 18A:
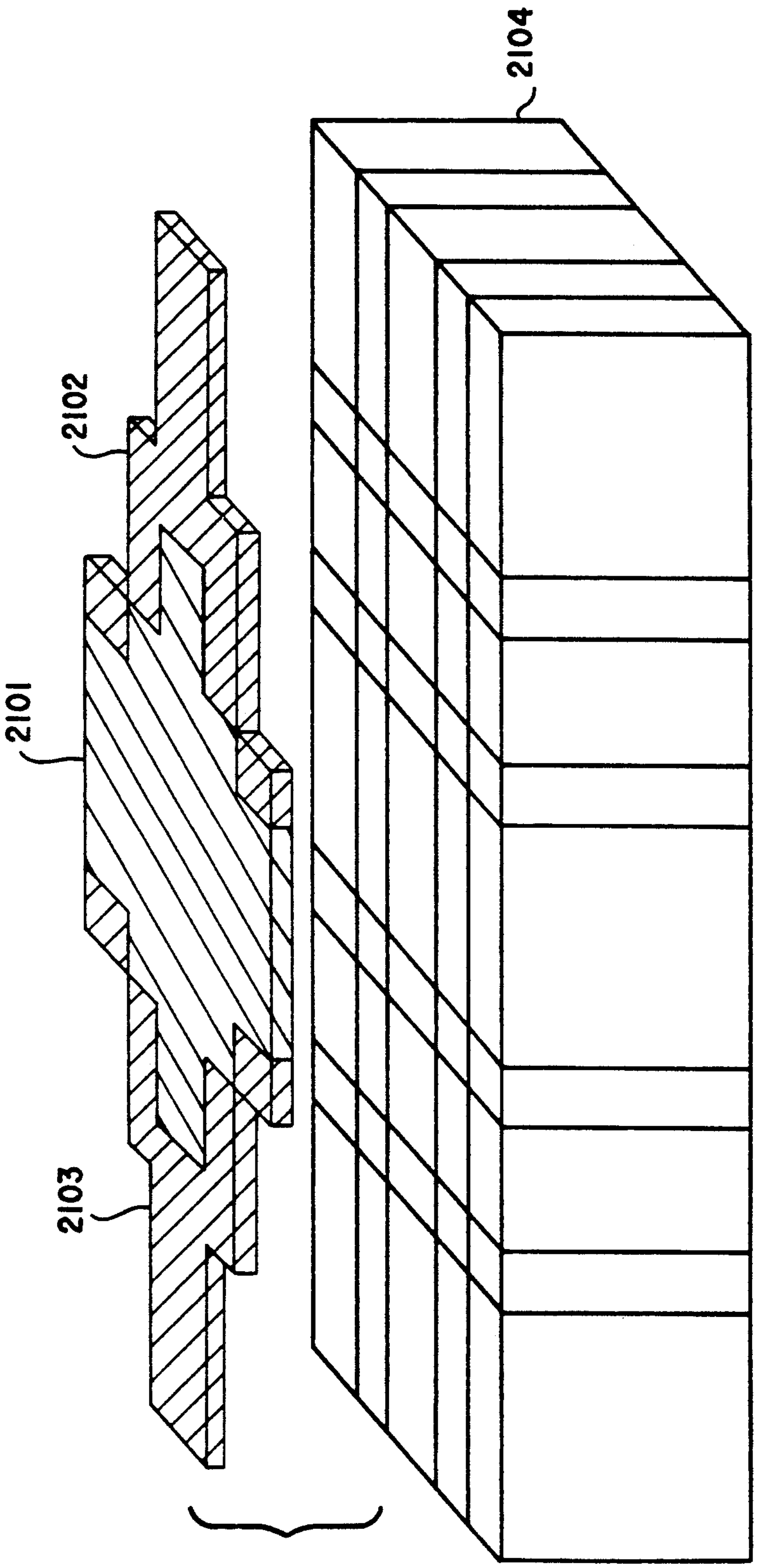
FIGS. 18(A)-18(C) are diagrams for explaining an embodiment where the insulation material is arranged with equal intervals in the short axis direction but with different intervals in the arrangement direction and the shape of the electrode surface is changed.
Figure 18B:
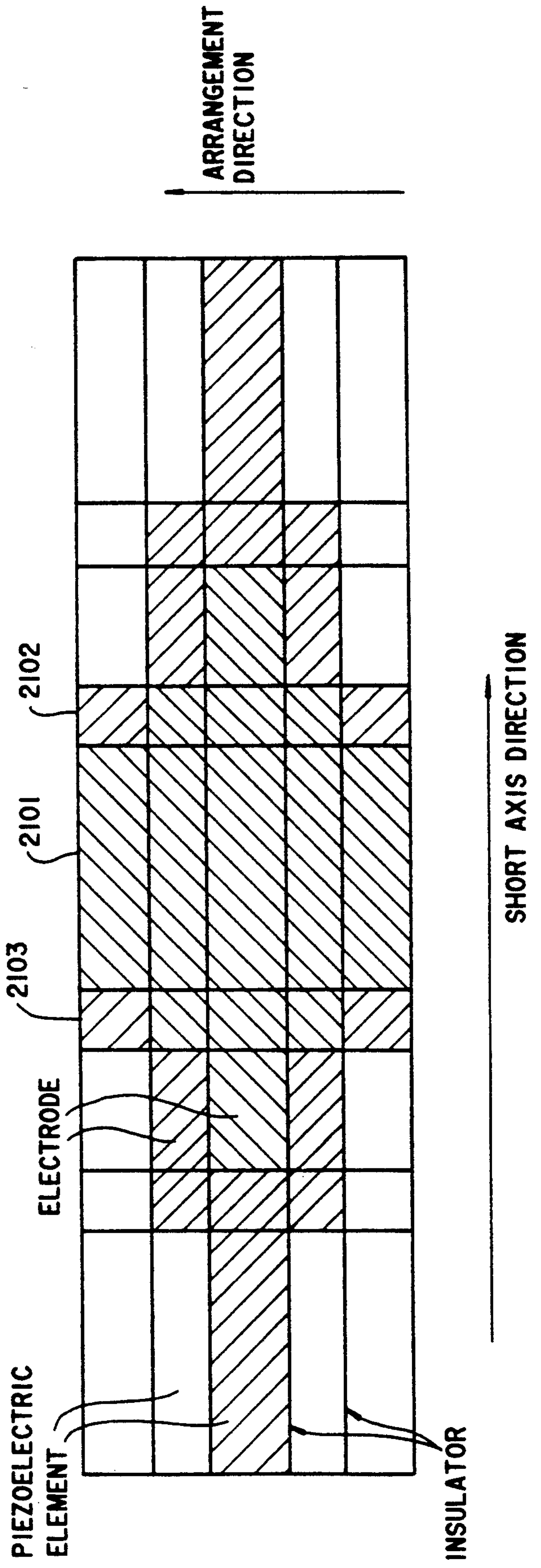
Figure 18C:
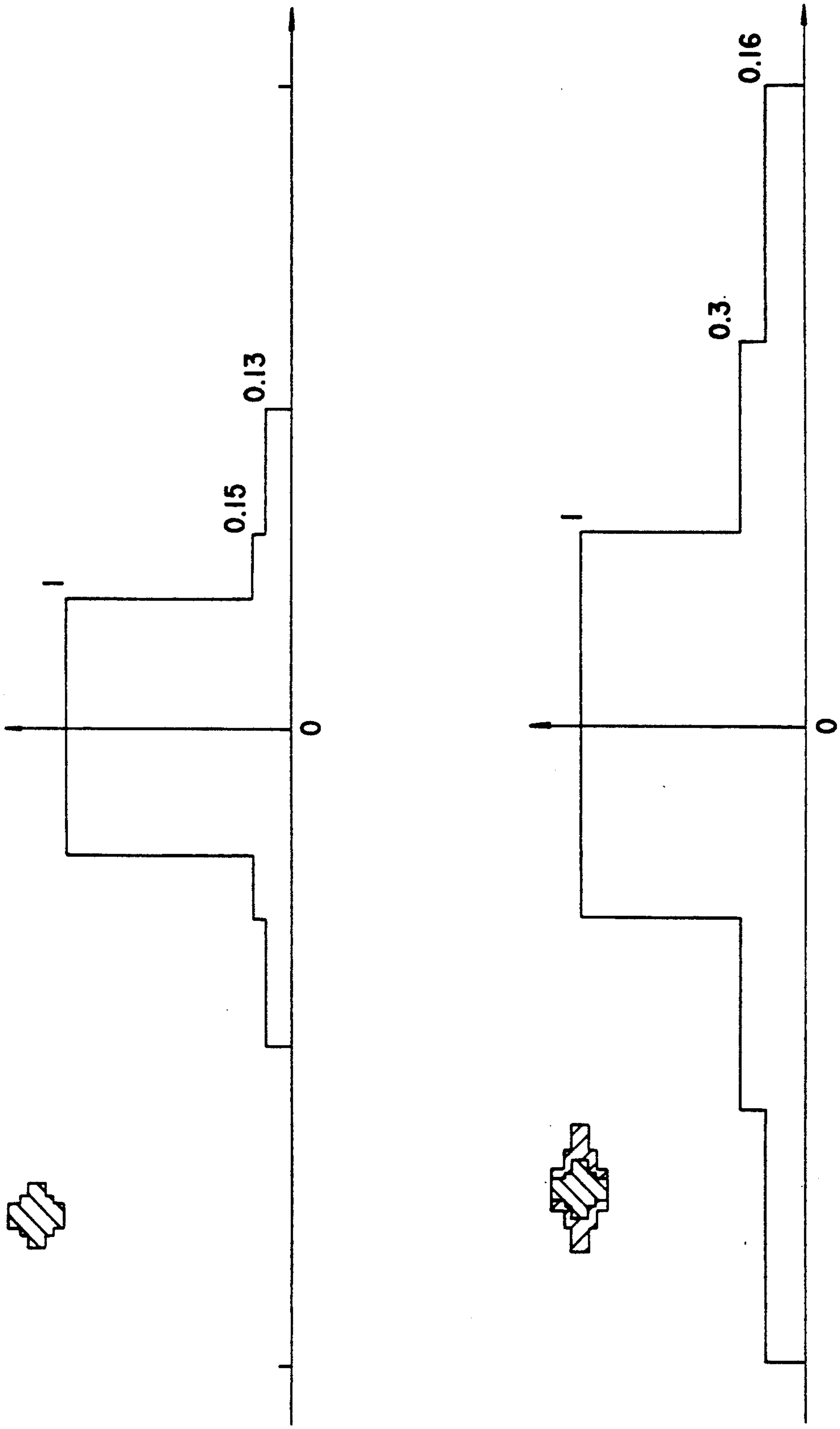

Moreover, FIG. 18[A] is an embodiment where the interval is not equal both in the short axis direction and the arrangement direction and shape of electrode plane is changed. The relationship between the structure of electrodes 2101, 2102, 2103 and the electrode of the composite piezoelectric vibrator 2104 is similar to that shown in FIGS. 17(A)-17(B). In the structure of FIGS. 18(A)-18(B), the length of the piezoelectric vibrator is unequal. Therefore, a higher density distribution of the amplitude intensity of the piezoelectric vibrator than that of FIGS. 17(A)-17(B) may be realized. FIG. 18[B] is a plan view of the structure. This figure expresses in the same manner as FIG. 17[B].

Figure 19:
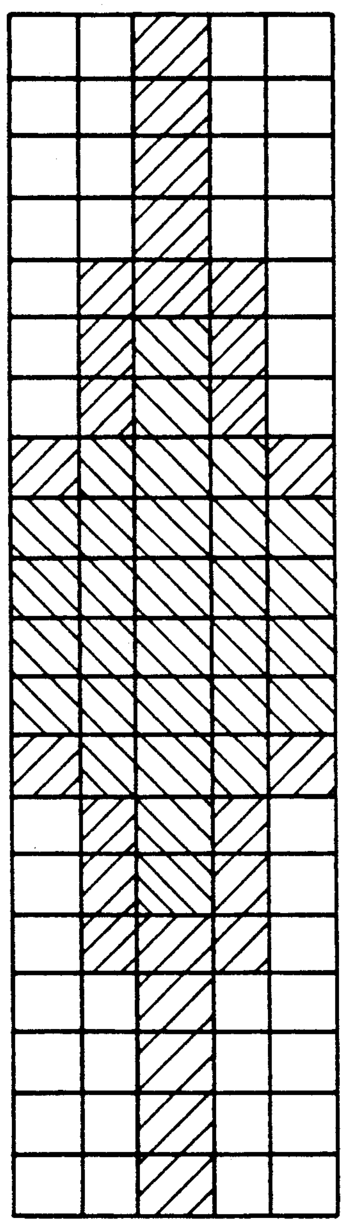
FIG. 19 is a diagram of an embodiment formed by further minute composite piezoelectric vibrators.

FIG. 18[C] indicates the graphs wherein amplitude intensity is distributed step by step. The numerical data in the graphs of FIG. 18[C] shows the ratio of each point when the maximum amplitude intensity is set to 1. FIG. 19 shows an embodiment when the transducer formed by further small size composite vibrators (expressed in the same way as FIG. 17[B]).

Figure 16A:
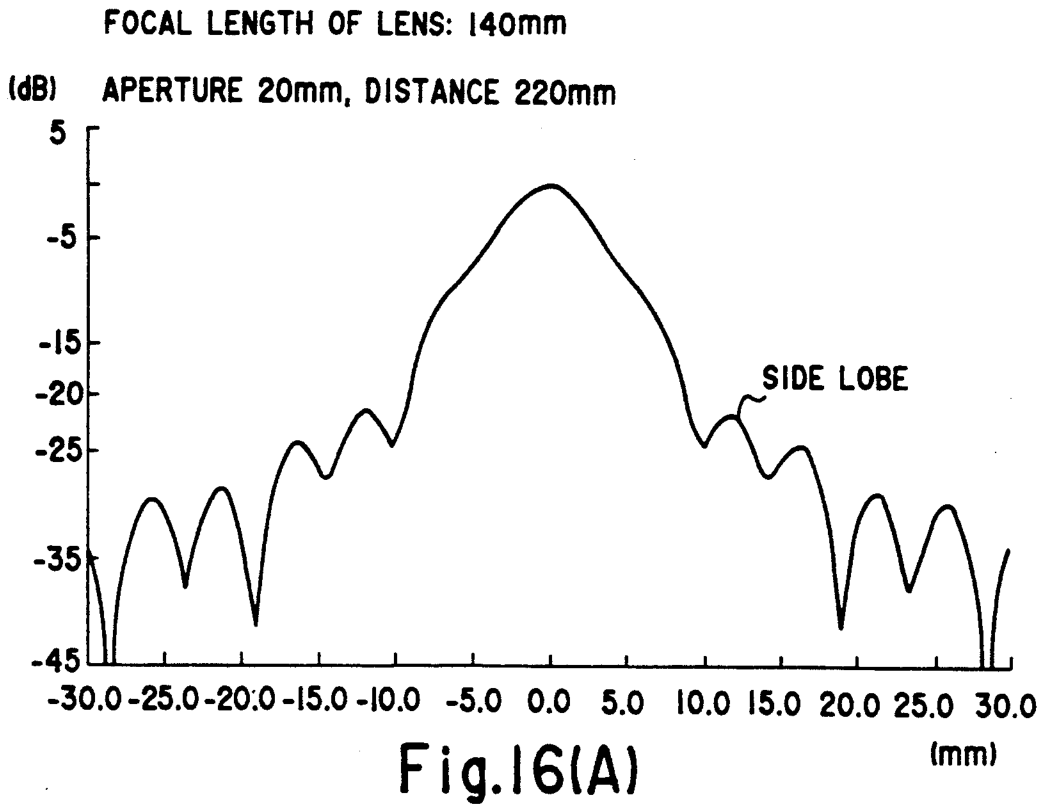
FIGS. 16(A)-16(B) are diagrams for explaining the ultrasonic field in the far distance area of 220 mm and the electrical - mechanical coupling coefficient is 0.3 and 0.4 at the end portions when that of the center of the piezoelectric element is set to 1.
Figure 16B:
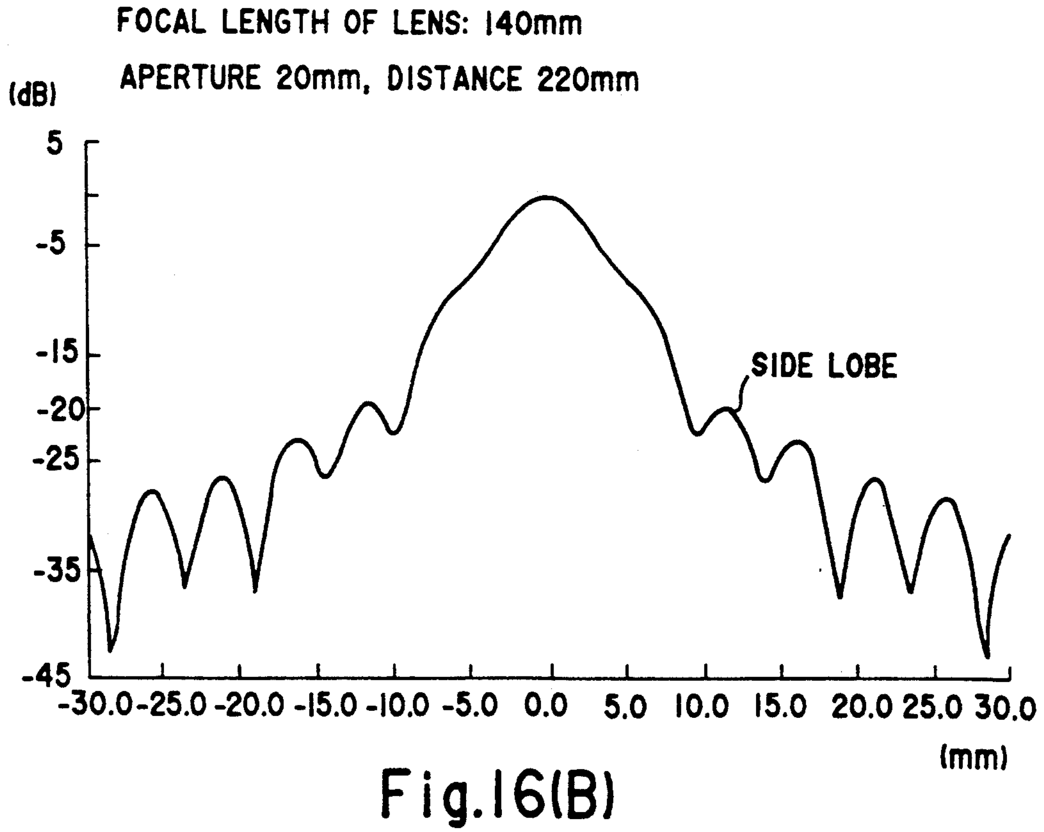

According to these embodiments, the mosaic structure through combination of the piezoelectric element of composite piezoelectric material and insulator is not required to be dense as shown as in FIG. 7 and it can be formed roughly with easiness. Moreover, these embodiments described above are linear approximation of the rhombus electrode type as shown in FIGS. 16(A)-16(B) forming the electrodes in step by step and the effect thereof may be assumed easily.

Figure 20:
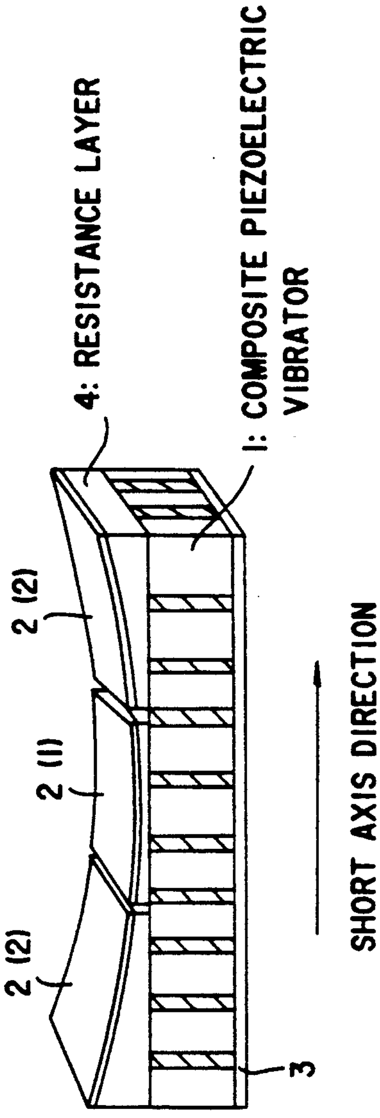
FIG. 20 is a diagram for explaining another embodiment having an amplitude intensity distribution in the short axis direction.

FIG. 20 indicates another embodiment which gives the amplitude intensity distribution in the short axis direction.

In this embodiment, a resistance layer 4 is provided between the surface and electrode plane 2 of composite piezoelectric vibrator and thickness of this resistance layer 4 becomes thicker gradually as it goes to the end portion from the center in the short axis direction. Thereby, the signal voltage level applied to the electrode surfaces 2 ①, 2 ② becomes lower as it goes to the end portion from the center, due to a voltage drop generated in the thickness direction in the resistance layer 4. Therefore, the amplitude intensity becomes smaller as it goes to the end portion from the center.

Figure 21:
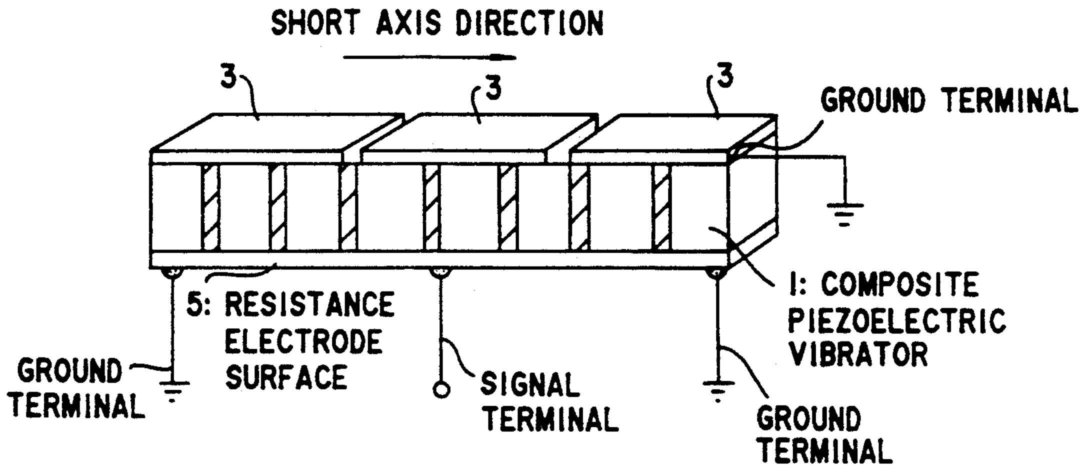
FIG. 21 is a diagram for explaining another embodiment having an amplitude intensity distribution in the short axis direction.

FIG. 21 shows another embodiment which gives the amplitude intensity distribution in the short axis direction. In this embodiment, the electrode surface 5 covering the entire part of vibrator is formed by a resistance material such as the signal electrode. A signal is applied to the center of this electrode surface 5 in the short axis direction and the end portion is grounded. Moreover, the electrode surface is divided in the short axis direction in order to increase or decrease the size of aperture 3 on the grounded side. When the signal is applied to the center of this electrode surface 5, the voltage level of the signal to be applied to each position in the short axis direction to the composite piezoelectric vibrator 1 shows a voltage drop at the electrode surface 5 consisting of the resistance material in the short axis direction and thereby the amplitude intensity is also gradually reduced as it goes to the end portion from the center.

Figure 22:
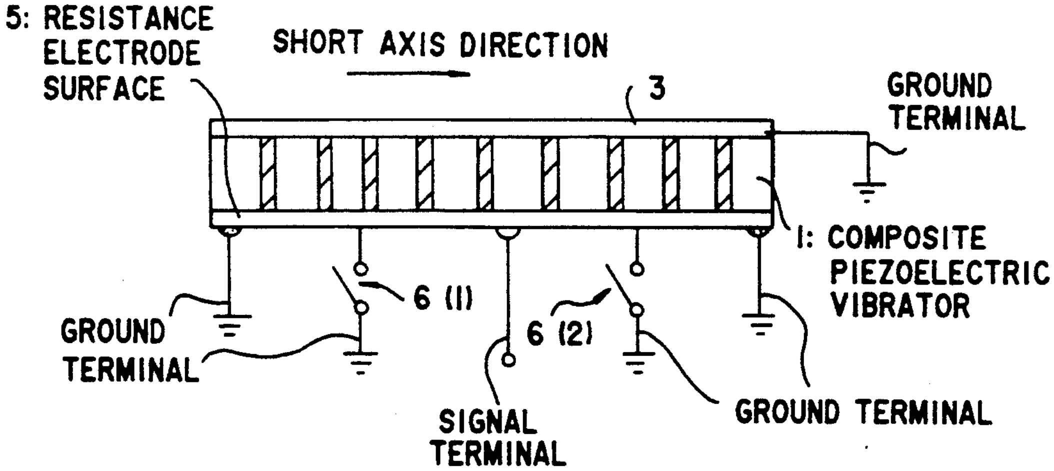
FIG. 22 is a diagram for explaining another embodiment having an amplitude intensity distribution in the short axis direction.

FIG. 22 is another embodiment which gives the amplitude intensity distribution in the short axis direction. In this embodiment with the structure shown in FIG. 21, when the electrode 5 is grounded with the switches 6 ①, 6 ② for grounding the position of the electrode 5 between the center of signal electrode 5 in the short axis direction and both end portions, the aperture size of vibrator becomes small determined by the distance between the switches 6 ① and 6 ②. Meanwhile, when the switches 6 ① and 6 ② are opened, the aperture becomes large determined by the area of the electrode surface 5. In the case of the embodiment shown in FIG. 22, the size of the aperture may be increased and decreased freely even when the electrode surface of the composite piezoelectric vibrator 1 is not divided in the short axis direction.

APPLICABILITY IN INDUSTRY

As explained previously, the present invention is easily capable of improving an ultasonic beam characteristic in the short axis direction. Moreover, realization of easy and free distribution of amplitude intensity with the shape of the electrode may be a contribution to development of the industry by the present invention.

Moreover, the ultrasonic transducer having a uniform beam pattern for short to long distance areas can also be manufactured easily.

In addition, since a composite piezoelectric vibrator is used, a convex type or concave type transducer having a curvature may also be manufactured easily. Moreover, it is also possible to easily improve the ultrasonic beam characteristic in the short axis direction utilizing the feature of the present invention and desired distribution of the amplitude intensity can be realized easily only changing the shape of the electrode.

Furthermore, the efficiency may be improved by approximating acoustic impedance to a human body's acoustic impedance.

We claim:

1. An ultrasonic transducer for controlling an ultrasonic beam comprising:
   - a plurality of piezoelectric elements arranged in a form of an array in an insulator to form a composite piezoelectric element vibrator, a plurality of said composite piezoelectric element vibrators forming an ultrasonic vibrator; and
   - electrodes attached to said composite piezoelectric vibrators and divided in a short axis direction orthogonally crossing an arrangement direction of said plurality of piezoelectric elements.

2. An ultrasonic transducer according to claim 1, wherein the amplitude intensity of ultrasonic beam irradiated from said composite piezoelectric vibrator is weighted so that amplitude intensity becomes large at the center of the composite piezoelectric vibrator in the short axis direction and becomes small toward the end portion in said short axis direction orthogonally crossing the arrangement direction of said composite piezoelectric vibrator.

3. An ultrasonic transducer for controlling an ultrasonic beam comprising:
   - a plurality of piezoelectric elements arranged in a form of an array in an insulator to form a composite piezoelectric element vibrator, a plurality of said composite piezoelectric vibrators forming an ultrasonic vibrator; and
   - a means attached to said composite piezoelectric vibrators for controlling an aperture for irradiating said ultrasonic beam in a short axis direction orthogonally crossing an arrangement direction of each said composite piezoelectric vibrator.

4. An ultrasonic transducer according to claim 3, comprising a means for weighting amplitude of ultrasonic beam irradiated from a composite piezoelectric vibrator in said short axis direction which is provided on said composite piezoelectric vibrator to control the amplitude so that it becomes large at the center in said short axis direction of composite piezoelectric vibrator and becomes small gradually as it goes to the end portion.

5. An ultrasonic transducer according to claim 4, wherein the electrode for weighting ultrasonic beam amplitude irradiated from a composite piezoelectric vibrator in said short axis direction is provided on said composite piezoelectric vibrator and the electrode surface of each piezoelectric vibrator is formed so that the area becomes wide at the center in the short axis direction and becomes narrow toward the end portion.

6. An ultrasonic transducer according to claim 3, comprising a means for giving said ultrasonic beam amplitude intensity distribution in said short axis direction, said means having a resistance layer provided between the piezoelectric material surface and the electrode surface of a composite piezoelectric vibrator, and thickness of resistance layer formed so that it becomes thick toward the end portion from the center in the short axis direction.

7. An ultrasonic transducer according to claim 3, wherein the electrode surface of each vibrator is formed by a resistance material and voltage distribution of the signal applied to the electrode surface from the center of vibrator in the short axis direction becomes gradually small toward the end portion from the center.

8. An ultrasonic transducer for controlling an ultrasonic beam comprising:

a plurality of piezoelectric elements arranged in a form of an array in an insulator forming a composite piezoelectric vibrator as an ultrasonic vibrator;

an electrode formed by resistance material formed on said ultrasonic vibrator, and a voltage distribution applied to said electrode becomes small gradually toward an end portion of the ultrasonic vibrator from a center of the ultrasonic vibrator in a short axis direction orthogonally crossing an arrangement direction of said piezoelectric elements; and switches connected to said electrode for grounding a position between the center and end portion of said ultrasonic vibrator in the short axis direction.

9. An ultrasonic transducer according to claim 5 controlling the size of aperture in the short axis direction wherein amplitude intensity of said ultrasonic beam in the short axis direction is given to each aperture of said ultrasonic transducer and when the width in the arrangement direction of the center area of the electrode plane of vibrator in the short axis direction is set to 1, the width of end portion of the said electrode plane in the short axis direction is set to 0.4 or less as the means for giving amplitude intensity distribution.

10. An ultrasonic transducer according to claim 9 for substantially controlling the size of aperture in the short axis direction, wherein amplitude intensity in the shot axis direction is given to each aperture of said ultrasonic transducer and the electrode is formed in step by step as it goes to the end portion from the center in the short axis direction as a means for giving amplitude intensity distribution.

11. An ultrasonic transducer for controlling an ultrasonic beam comprising:

a composite piezoelectric element as an ultrasonic vibrator which uses a composite piezoelectric material, said composite piezoelectric material including a plurality of piezoelectric vibrators and an insulator provided between said piezoelectric vibrators forming one piezoelectric element unit in an arrangement direction, a plurality of said piezoelectric elements units are arranged in an array; and a plurality of electrodes arranged on said piezoelectric element units, said electrodes include a first electrode provided at a center of the ultrasonic vibrator in a short axis direction orthogonally crossing the arrangement direction of said composite piezoelectric element and a second electrode provided surrounding or in a periphery of the first electrode provided at the center wherein aperture control of said ultrasonic beam is controlled with said first and second electrodes.

12. An ultrasonic transducer according to claim 11, wherein shape of said first electrode almost matches with the shape of the one or a plurality of piezoelectric vibrators in the side of ultrasonic beam irradiation forming said unit piezoelectric vibrator in the arrangement direction and shape of said second electrode almost matches with the shape of the one or a plurality of piezoelectric vibrators in the side of ultrasonic beam irradiation located in the periphery of said first electrode.

13. An ultrasonic transducer according to claims 11 or 12, wherein said unit piezoelectric vibrator in the arrangement direction has a structure that a plurality of piezoelectric vibrators are arranged like a matrix and the insulator is provided between said piezoelectric vibrators.

14. An ultrasonic transducer according to claims 11 or 12 wherein said first and second electrodes are thick at the center in the arrangement direction but becomes narrow gradually as it goes to the end portion.

* * * * *